(12) United States Patent
Lou

(10) Patent No.: US 8,198,725 B2
(45) Date of Patent: Jun. 12, 2012

(54) HEAT SINK AND INTEGRATED CIRCUIT ASSEMBLY USING THE SAME

(75) Inventor: Choon Leong Lou, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 0 days.

(21) Appl. No.: 12/651,006

(22) Filed: Dec. 31, 2009

(65) Prior Publication Data

US 2011/0156244 A1 Jun. 30, 2011

(51) Int. Cl.
*H01L 23/34* (2006.01)
(52) U.S. Cl. ... 257/713; 257/706; 257/722; 257/E23.08; 165/185
(58) Field of Classification Search .................. 257/722, 257/713, 706, E23.08; 165/185
See application file for complete search history.

(56) References Cited

U.S. PATENT DOCUMENTS

| 3,217,793 | A | * | 11/1965 | Coe ............................... 165/80.3 |
| 5,353,193 | A | | 10/1994 | Chia et al. |
| 6,627,980 | B2 | * | 9/2003 | Eldridge ........................ 257/678 |
| 2002/0149095 | A1 | | 10/2002 | Eldridge |

FOREIGN PATENT DOCUMENTS

JP 60-250655 12/1985

OTHER PUBLICATIONS

Office Action issued on Dec. 22, 2011 from Korea counterpart application 10-2010-0081469.

* cited by examiner

*Primary Examiner* — Jasmine Clark
(74) *Attorney, Agent, or Firm* — WPAT, P.C.; Anthony King

(57) ABSTRACT

An integrated circuit assembly includes a heat sink and a substrate coupled to the heat sink. The heat sink includes a base and a plurality of fins disposed on the base, the base has an intermediate portion and two side portions connected to the intermediate portion, the intermediate portion has a first width and the side portions has a second width larger than the first width, and the fins are disposed on the side portions of the base. The substrate is made of ceramic material and has an upper surface with an opening and a lower surface with a groove, the groove matches the intermediate portion of the heat sink, and the opening is configured to expose a portion of the intermediate portion to receive an integrated circuit package.

14 Claims, 4 Drawing Sheets

HEAT SINK AND INTEGRATED CIRCUIT ASSEMBLY USING THE SAME

BACKGROUND OF THE INVENTION (A) Field of the Invention

The present disclosure relates to a heat sink and an integrated circuit assembly using the same, and more particularly, to an integrated circuit assembly using the heat sink to remove the thermal energy produced by the operation of the integrated circuit packaged on the heat sink during the operation or the electric testing process.

(B) Description of the Related Art

The demand for reduction in size and increase in complexity and performance of electronic components has driven the industry to produce smaller and more complex integrated circuits (ICs). These same trends have forced the development of IC packages having small footprints, high lead counts, and better electrical and thermal performance. At the same time, these IC packages are required to meet accepted industry standards. Power dissipation is a particular challenge since higher performance ICs produce more thermal energy, and the smaller packages of today allow the designer few options through which to dissipate this energy.

Another problem is that the IC packages are usually much smaller than a heat sink of the size required for the appropriate amount of thermal dissipation. This makes the mounting of the heat sink even more difficult, the reason being that the interface between the IC packages and heat sink must be carefully controlled in order to obtain high thermal performance, and a large heat sink is difficult to mount precisely on a relatively small IC package. U.S. Pat. No. 5,353,193 discloses a high power dissipating package with matched heatspreader heatsink assembles.

SUMMARY OF THE INVENTION

One aspect of the present disclosure provides an integrated circuit assembly using the heat sink to remove the thermal energy produced by the operation of the integrated circuit package on the heat sink during the operation or the electric testing process.

A heat sink according to this aspect of the present disclosure comprises a base and a plurality of fins disposed on the base, the base having an intermediate portion and two side portions connected to the intermediate portion, the intermediate portion having a first width and the side portions having a second width larger than the first width, the fins being disposed on the side portions of the base.

Another aspect of the present disclosure provides an integrated circuit assembly comprising a heat sink and a substrate coupled to the heat sink. The heat sink comprises a base and a plurality of fins disposed on the base, the base has an intermediate portion and two side portions connected to the intermediate portion, the intermediate portion has a first width and the side portions have a second width larger than the first width, and the fins are disposed on the side portions of the base. The substrate is made of ceramic and has an upper surface with an opening and a lower surface with a groove, the groove matches the intermediate portion of the heat sink, and the opening is configured to expose a portion of the intermediate portion to receive an integrated circuit package.

The foregoing has outlined rather broadly the features and technical advantages of the present disclosure in order that the detailed description of the invention that follows may be better understood. Additional features and advantages of the invention are described hereinafter, and form the subject of the claims of the invention. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the invention as set forth in the appended claims.

BRIEF DESCRIPTION OF THE DRAWINGS

The objectives and advantages of the present disclosure will become apparent upon reading the following description and upon reference to the accompanying drawings in which.

DETAILED DESCRIPTION OF THE INVENTION

Figure 1:
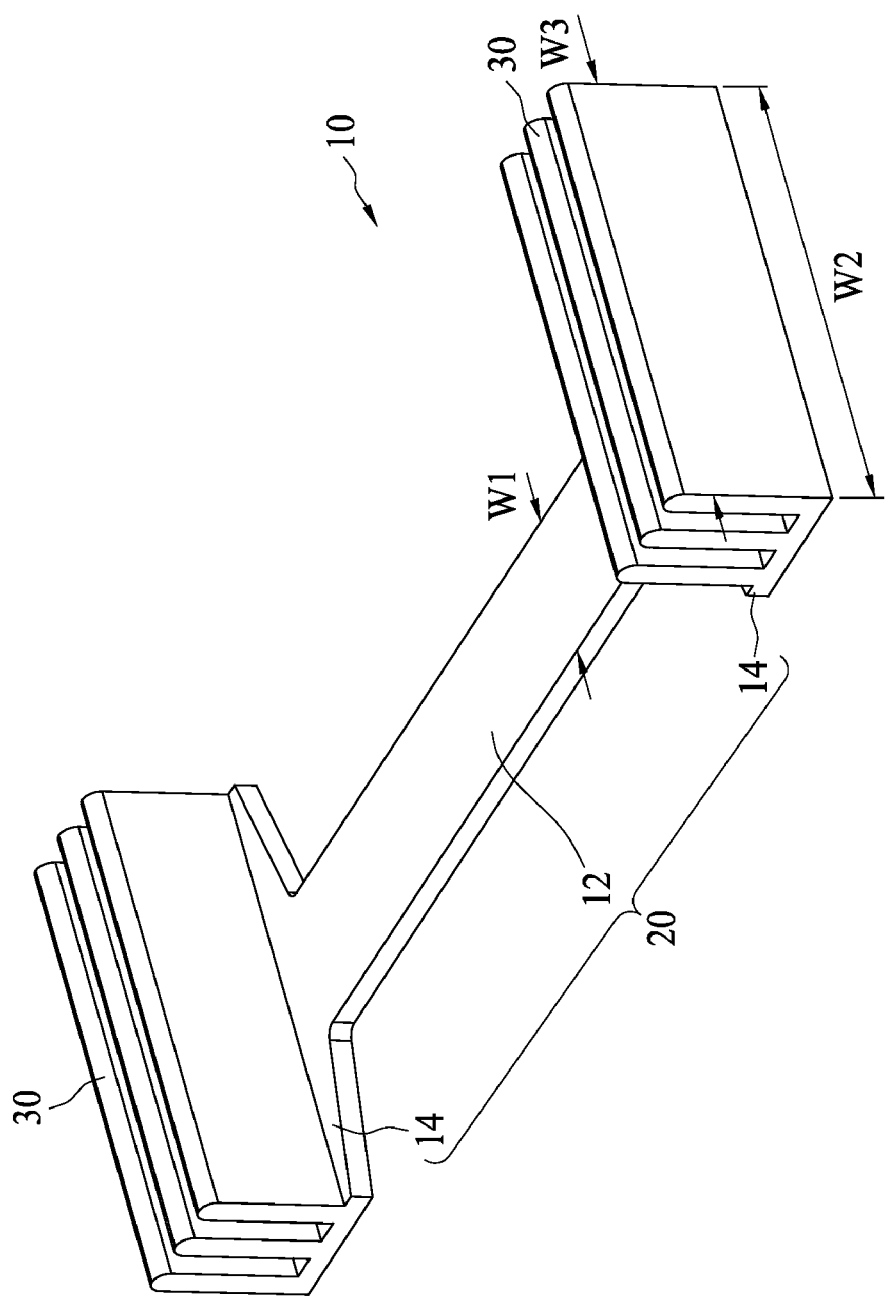
FIG. 1 is a full view of a heat sink according to one embodiment of the present disclosure.

FIG. 1 is a full view of a heat sink 10 according to one embodiment of the present disclosure. The heat sink 10 comprises a base 20 having an intermediate portion 12 and two side portions 14 connected to the intermediate portion 12, and a plurality of fins 30 disposed on the side portions 14 of the base 20. The intermediate portion 12 has a first width (W1), and the side portions 14 have a second width (W2) larger than the first width (W1) such that the base 20 is substantially I-shaped. In one embodiment of the present disclosure, the fins 30 have a third width (W3) substantially the same as the second width (W2). In one embodiment of the present disclosure, the base 20 is made of conductive material such as aluminum or copper, and the fins 30 and the base 20 can be made of the same conductive material.

Figure 2:
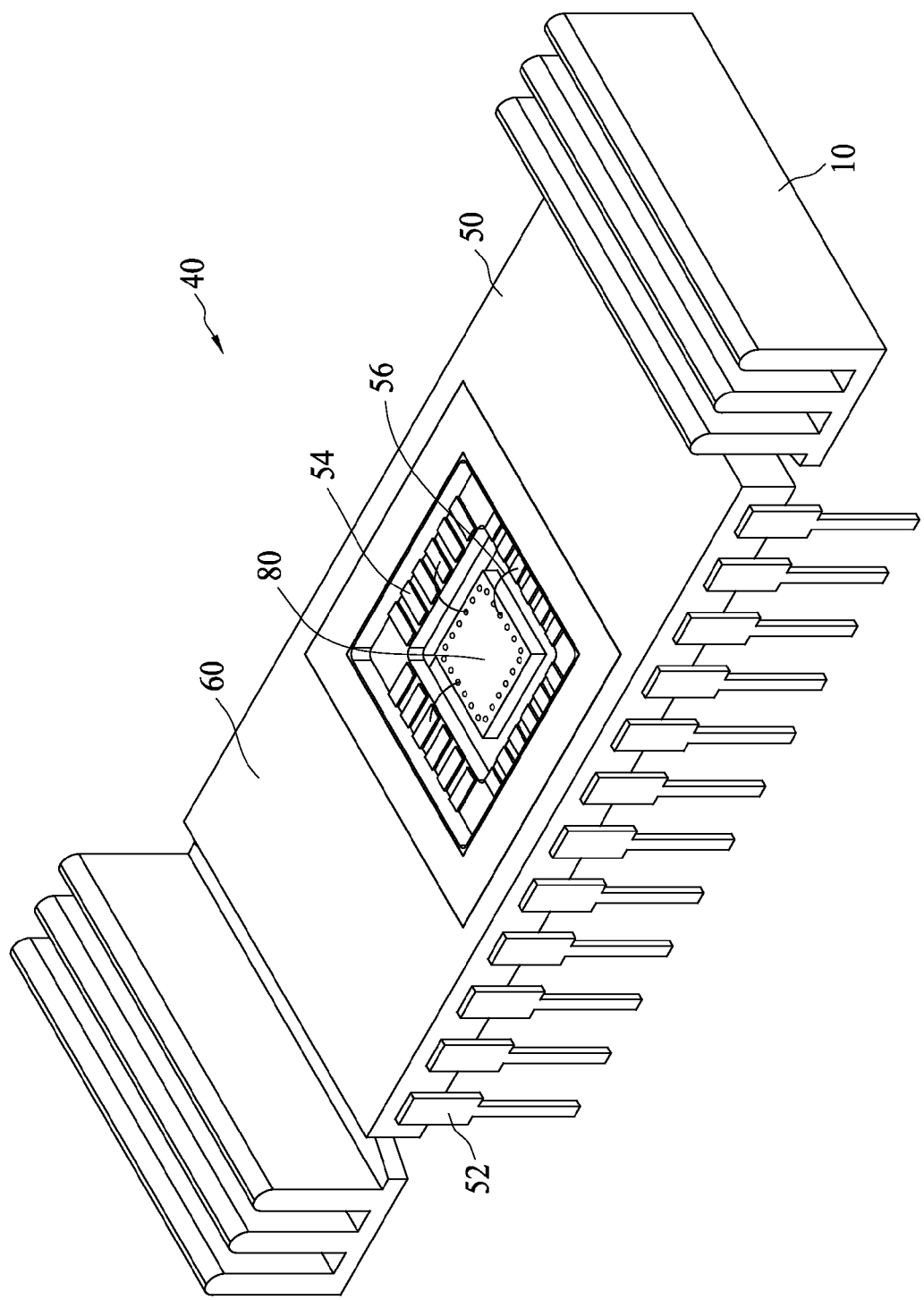
FIG. 2 is a full view of an integrated circuit assembly according to one embodiment of the present disclosure.
Figure 3:
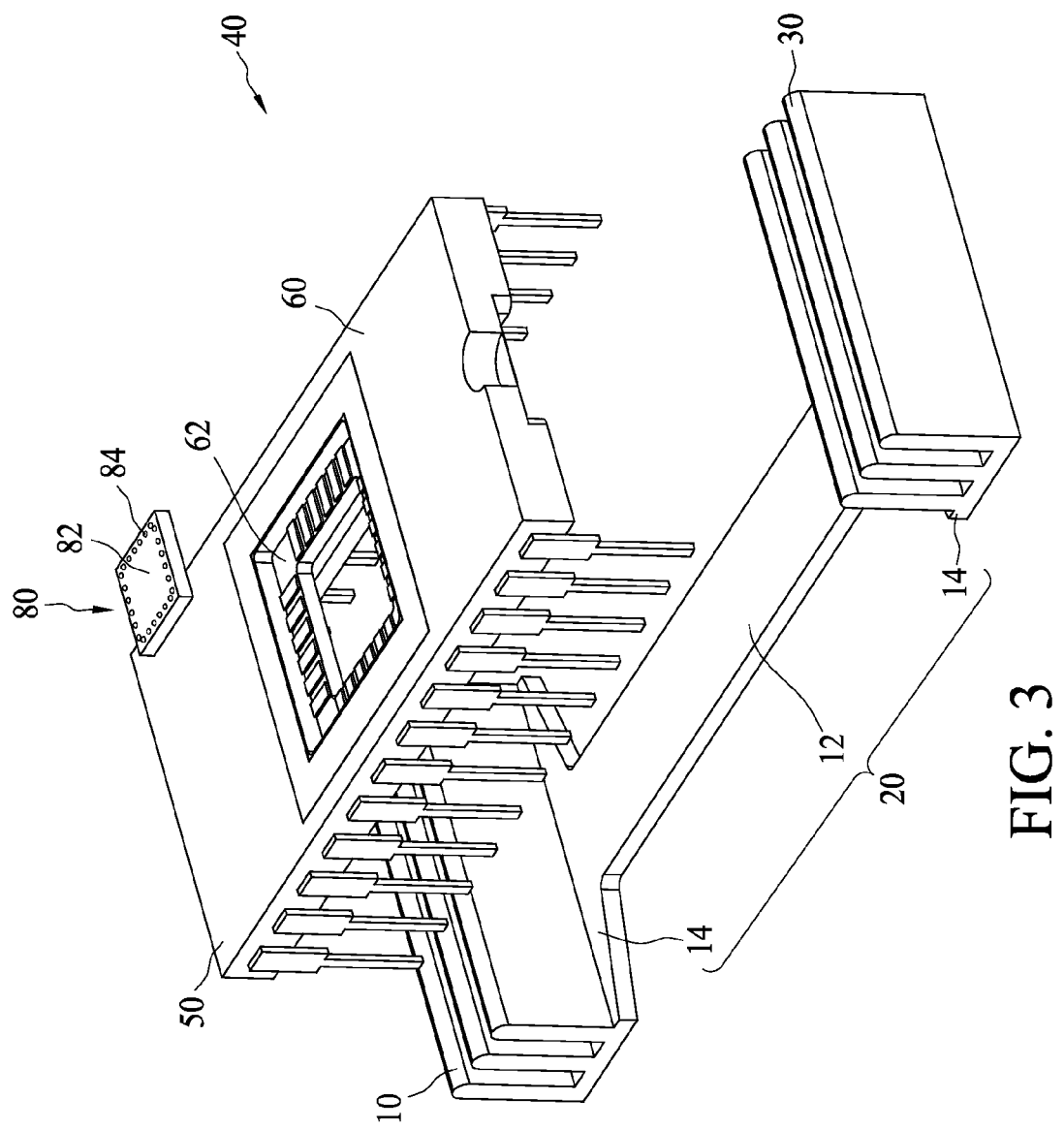
FIG. 3 and FIG. 4 are exploded views of integrated circuit assembly from different orientations.
Figure 4:
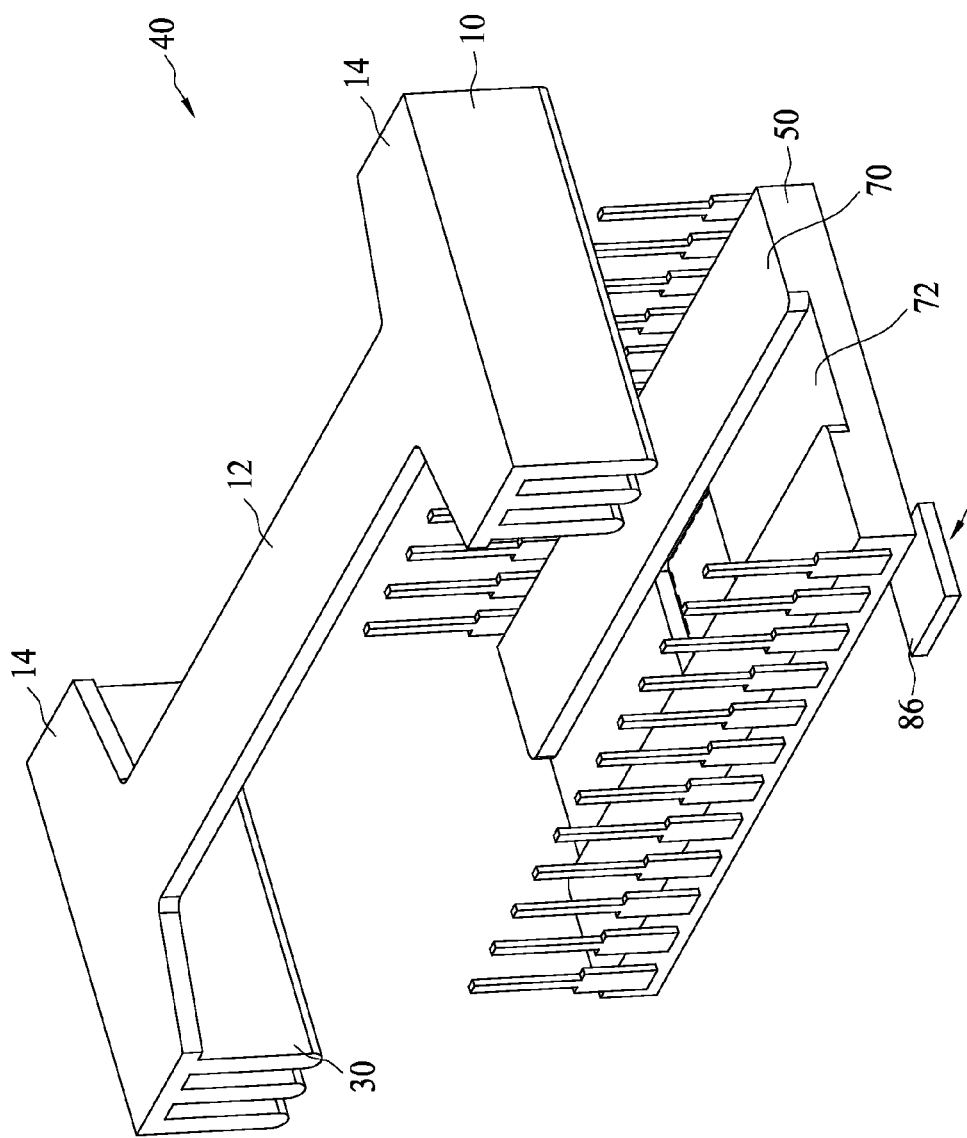

FIG. 2 is a full view of an integrated circuit assembly 40 according to one embodiment of the present disclosure, and FIG. 3 and FIG. 4 are exploded views of the integrated circuit assembly 40 from different orientations. The integrated circuit assembly 40 comprises a heat sink 10 and a substrate 50 coupled to the heat sink 10. In one embodiment of the present disclosure, the heat sink 10 comprises a base 20 having an intermediate portion 12 and two side portions 14 connected to the intermediate portion 12, and a plurality of fins 30 disposed on the side portions 14 of the base 20. The intermediate portion 12 has a first width (W1), and the side portions 14 have a second width (W2) larger than the first width (W1) such that the base 20 is substantially I-shaped. In one embodiment of the present disclosure, the fins 30 have a third width (W3) substantially the same as the second width (W2). In one embodiment of the present disclosure, the base 20 is made of conductive material such as aluminum or copper, and the fins 30 and the base 20 can be made of the same conductive material.

In one embodiment of the present disclosure, the substrate 50 is made of ceramic having an upper surface 60 with an opening 62 and a lower surface 70 with a groove 72, the groove matches the intermediate portion 12 of the heat sink 10, and the opening 62 is configured to expose a portion of the intermediate portion 12 to receive an integrated circuit package 80. In one embodiment of the present disclosure, the substrate 50 includes a plurality of pins 52 disposed at the front side and the back side, a plurality of contacts 54 disposed around the opening 62, and the pins 52 electrically connect the contacts 54. In one embodiment of the present disclosure, the integrated circuit package 80 includes a bottom surface 86 attached to the intermediate portion 12 and a top surface 82 having a plurality of terminals 84, and the substrate 50 includes a plurality of wires 56 electrically connecting the contacts 54 and the terminals 84.

The heat sink 10 is designed to have a first thermal conductivity, the substrate 50 has a second thermal conductivity smaller than the first thermal conductivity, and the integrated circuit package 80 is attached to the intermediate portion 12 of the heat sink 10 with an adhesive having high heat transfer characteristics such as silicone. Consequently, during the operation or the electric testing process, the thermal energy produced by the operation of the integrated circuit package 80 will be efficiently removed from the bottom surface 86 attached to the intermediate portion 12 of the heat sink 10, particularly for the operation or the electrical testing of the high power integrated circuit package 80.

Although the present disclosure and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit assembly, comprising:
   a heat sink including a base and a plurality of fins, the base having an intermediate portion and two side portions connected to the intermediate portion, the intermediate portion having a first width and the side portions having a second width larger than the first width, the fins being disposed on the side portions of the base; and
   a substrate having an upper surface with an opening and a lower surface with a groove, the groove matching the intermediate portion of the heat sink, the opening being configured to expose a portion of the intermediate portion to receive an integrated circuit package.

2. The integrated circuit assembly of claim 1, wherein the base is substantially I-shaped.

3. The integrated circuit assembly of claim 1, wherein the base is made of conductive material.

4. The integrated circuit assembly of claim 1, wherein the fins have a third width substantially the same as the second width.

5. The integrated circuit assembly of claim 1, wherein the fins and the base are made of the same conductive material.

6. The integrated circuit assembly of claim 1, wherein the intermediate portion is linear.

7. The integrated circuit assembly of claim 1, wherein the substrate includes a front side, a back side, and a plurality of pins disposed at the front side and the back side.

8. The integrated circuit assembly of claim 1, wherein the substrate includes a plurality of contacts disposed around the opening.

9. The integrated circuit assembly of claim 8, wherein the substrate includes a front side, a back side, and a plurality of pins disposed at the front side and the back side, wherein the pins electrically connect the contacts.

10. The integrated circuit assembly of claim 1, wherein the integrated circuit package includes a bottom surface attached to the intermediate portion and a top surface having a plurality of terminals.

11. The integrated circuit assembly of claim 10, wherein the substrate includes a plurality of contacts disposed around the opening, and a plurality of wires electrically connects the contacts and the terminals.

12. The integrated circuit assembly of claim 1, wherein the heat sink has a first thermal conductivity, and the substrate has a second thermal conductivity higher than the first thermal conductivity.

13. The integrated circuit assembly of claim 1, wherein the groove is linear.

14. The integrated circuit assembly of claim 1, wherein the substrate is made of ceramic material.

\* \* \* \* \*